US008895844B2

(12) United States Patent
Ding et al.

(10) Patent No.: US 8,895,844 B2
(45) Date of Patent: Nov. 25, 2014

(54) SOLAR CELL COMPRISING A PLASMONIC BACK REFLECTOR AND METHOD THEREFOR

(75) Inventors: I-Kang Ding, Sunnyvale, CA (US); Jia Zhu, San Jose, CA (US); Yi Cui, Stanford, CA (US); Michael David McGehee, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 269 days.

(21) Appl. No.: 13/306,731

(22) Filed: Nov. 29, 2011

(65) Prior Publication Data

US 2012/0125430 A1    May 24, 2012

Related U.S. Application Data

(63) Continuation-in-part of application No. 12/909,064, filed on Oct. 21, 2010.

(60) Provisional application No. 61/254,513, filed on Oct. 23, 2009, provisional application No. 61/263,582, filed on Nov. 23, 2009, provisional application No. 61/458,678, filed on Nov. 29, 2010.

(51) Int. Cl.
| | |
|---|---|
| H01L 31/0224 | (2006.01) |
| H01L 31/18 | (2006.01) |
| H01L 51/44 | (2006.01) |
| B82Y 20/00 | (2011.01) |
| H01G 9/20 | (2006.01) |
| H01L 51/00 | (2006.01) |
| H01L 51/42 | (2006.01) |

(52) U.S. Cl.
CPC .............. *B82Y 20/00* (2013.01); *Y02E 10/549* (2013.01); *H01G 9/2059* (2013.01); *H01L 51/447* (2013.01); *H01L 51/0096* (2013.01); *H01G 9/209* (2013.01); *H01L 51/4226* (2013.01); *Y02E 10/542* (2013.01); *H01L 2251/105* (2013.01); *H01G 9/2031* (2013.01)
USPC ........................................ 136/256; 438/98

(58) Field of Classification Search
CPC ..... H01G 9/2059; H01G 9/209; Y02E 10/542
USPC ........................................................ 136/256
See application file for complete search history.

(56) References Cited

U.S. PATENT DOCUMENTS

| | | | |
|---|---|---|---|
| 4,554,727 | A | 11/1985 | Deckman et al. |
| 4,633,030 | A | 12/1986 | Cook |

(Continued)

OTHER PUBLICATIONS

Rosello Garcia, M., "PCT Application No. PCT/US2010/053576 Written Opinion Dec. 27, 2011",, Publisher: PCT, Published in: PCT.

(Continued)

*Primary Examiner* — Long K Tran
*Assistant Examiner* — Jordan Klein
(74) *Attorney, Agent, or Firm* — Kaplan Breyer Schwarz & Ottesen, LLC

(57) ABSTRACT

A method for forming a solar cell having a plasmonic back reflector is disclosed. The method includes the formation of a nanoimprinted surface on which a metal electrode is conformally disposed. The surface structure of the nanoimprinted surface gives rise to a two-dimensional pattern of nanometer-scale features in the metal electrode enabling these features to collectively form the plasmonic back reflector.

22 Claims, 10 Drawing Sheets

(56) References Cited

U.S. PATENT DOCUMENTS

| | | | |
|---|---|---|---|
| 5,094,697 A | | 3/1992 | Takabayashi et al. |
| 5,101,260 A | * | 3/1992 | Nath et al. .................... 257/53 |
| 5,103,851 A | | 4/1992 | Nishida et al. |
| 5,269,852 A | | 12/1993 | Nishida |
| 5,453,135 A | * | 9/1995 | Nakagawa et al. ........... 136/259 |
| 5,810,945 A | | 9/1998 | Stutzmann et al. |
| 5,986,204 A | * | 11/1999 | Iwasaki et al. ................. 136/256 |
| 6,072,117 A | * | 6/2000 | Matsuyama et al. ........... 136/256 |
| 6,075,652 A | | 6/2000 | Ono et al. |
| 6,331,672 B1 | * | 12/2001 | Matsuda et al. .............. 136/256 |
| 6,806,141 B2 | | 10/2004 | Kamins |
| 7,301,215 B2 | | 11/2007 | Kariya |
| 7,812,355 B2 | | 10/2010 | Shiroguchi et al. |
| 8,133,768 B2 | | 3/2012 | Ray et al. |
| 8,183,587 B2 | * | 5/2012 | Samuelson et al. ............. 257/98 |
| 8,258,050 B2 | | 9/2012 | Cho et al. |
| 8,323,732 B2 | | 12/2012 | Ajayaghosh et al. |
| 2003/0138608 A1 | | 7/2003 | Landry-Coltrain et al. |
| 2007/0120141 A1 | * | 5/2007 | Moustakas et al. ........... 257/103 |
| 2008/0223436 A1 | * | 9/2008 | den Boer et al. .............. 136/256 |
| 2009/0107548 A1 | * | 4/2009 | Guerra .......................... 136/256 |
| 2009/0126789 A1 | * | 5/2009 | Li et al. ......................... 136/256 |
| 2009/0135491 A1 | * | 5/2009 | Endoh et al. .................. 359/601 |
| 2009/0223561 A1 | * | 9/2009 | Kim et al. ..................... 136/256 |
| 2009/0320910 A1 | * | 12/2009 | Matsui et al. ................. 136/252 |
| 2009/0325365 A1 | | 12/2009 | Park et al. |
| 2010/0089443 A1 | * | 4/2010 | Bloomstein et al. .......... 136/255 |
| 2010/0090341 A1 | * | 4/2010 | Wan et al. ..................... 257/749 |
| 2010/0243040 A1 | * | 9/2010 | Kim .............................. 136/255 |
| 2010/0269897 A1 | * | 10/2010 | Sakai et al. ................... 136/255 |
| 2010/0282308 A1 | * | 11/2010 | Okamoto ...................... 136/255 |
| 2010/0326710 A1 | * | 12/2010 | Zhang ........................... 174/257 |
| 2011/0129956 A1 | * | 6/2011 | Polito et al. .................... 438/71 |
| 2011/0180127 A1 | * | 7/2011 | Wan et al. ..................... 136/252 |
| 2011/0180141 A1 | * | 7/2011 | Nishida et al. ............... 136/256 |
| 2012/0132275 A1 | * | 5/2012 | Nishida et al. ............... 136/256 |

OTHER PUBLICATIONS

Ghyka, Alexander G., "Related U.S. Appl. No. 13/078,782 Office Action", Aug. 12, 2013, Publisher: USPTO, Published in: US.

Nikmanesh, Seahvosh J., "U.S. Appl. No. 12/948,025 Office Action Dec. 23, 2011", , Publisher: USPTO, Published in: US.

Jordan M. Klein, "Related U.S. Appl. No. 12/909,064 Office Action", Feb. 14, 2013, Publisher: USPTO.

Alexander G. Ghyka, "Related U.S. Appl. No. 13/078,782 Office Action", Feb. 15, 2013, Publisher: USPTO.

* cited by examiner

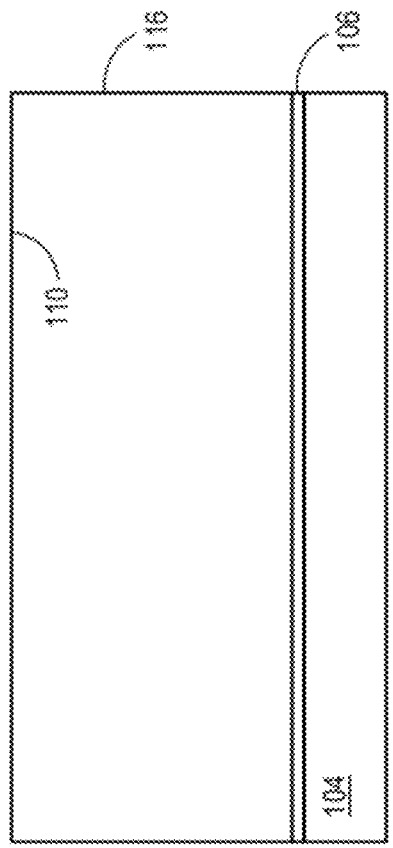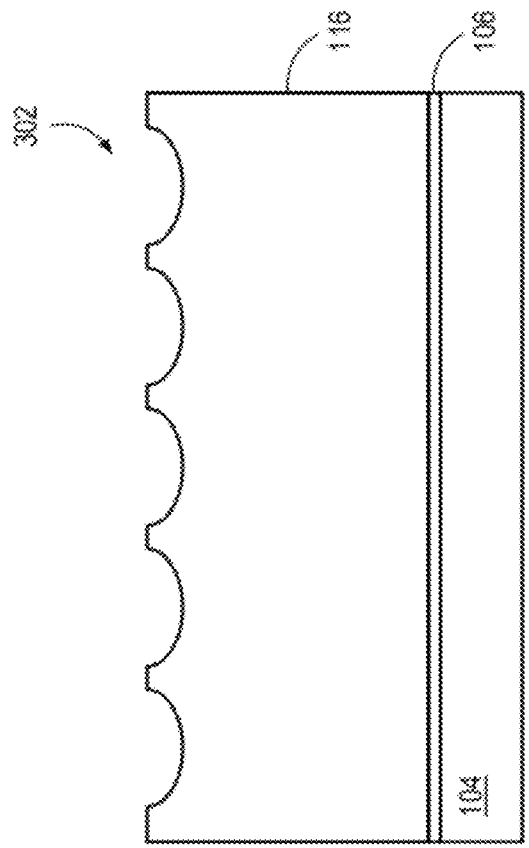
FIG. 3A
FIG. 3B

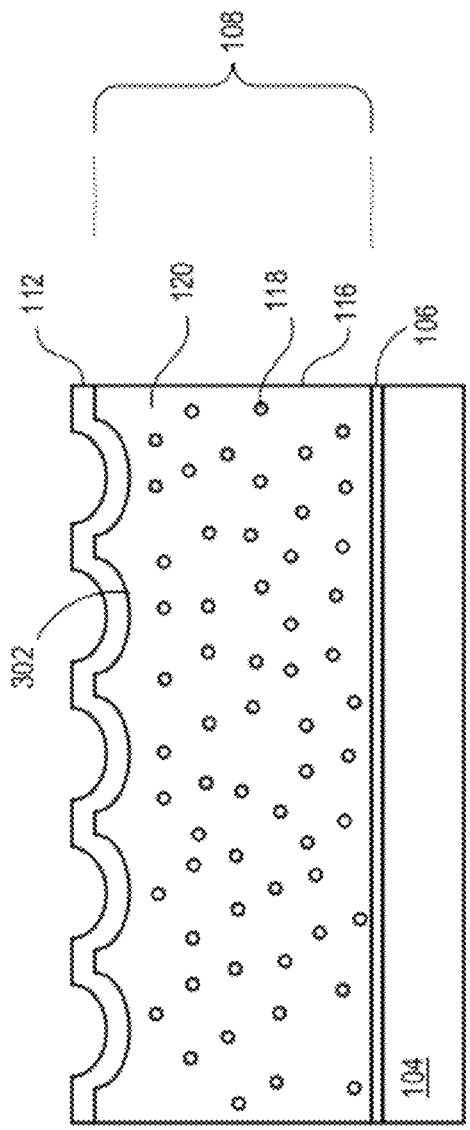
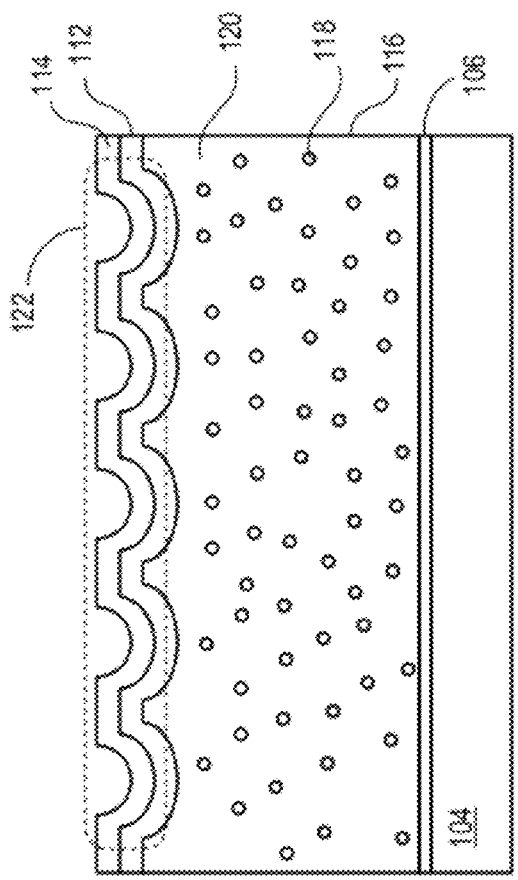
FIG. 3C
FIG. 3D

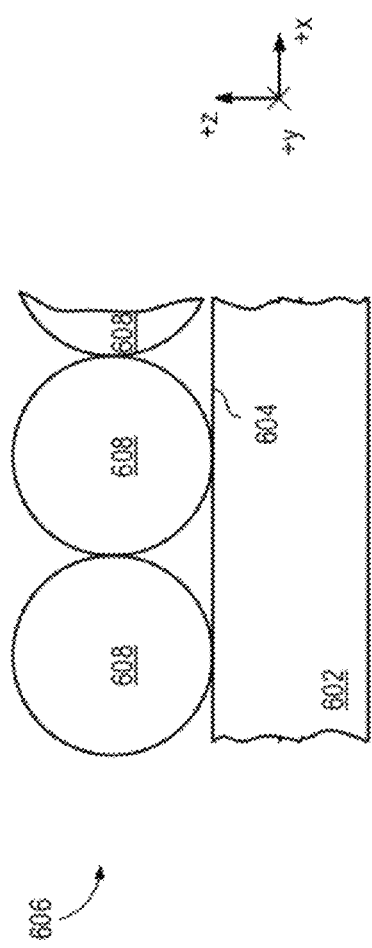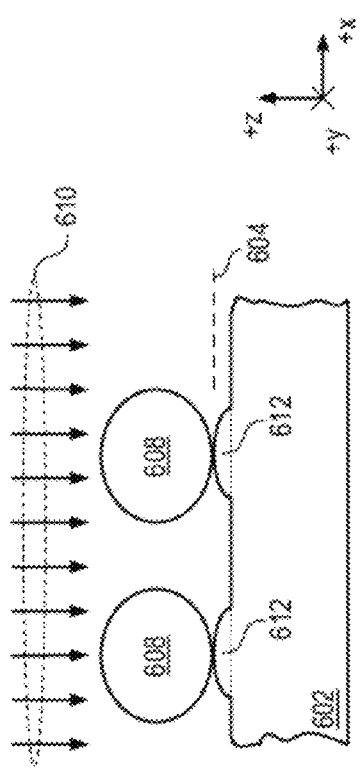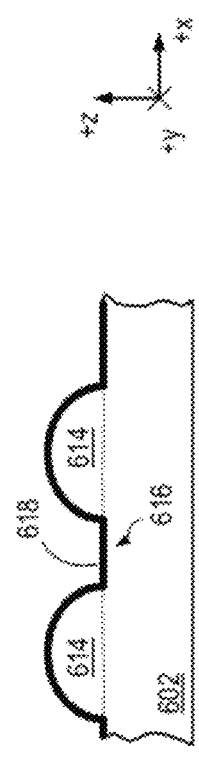
FIG. 6A
FIG. 6B
FIG. 6C

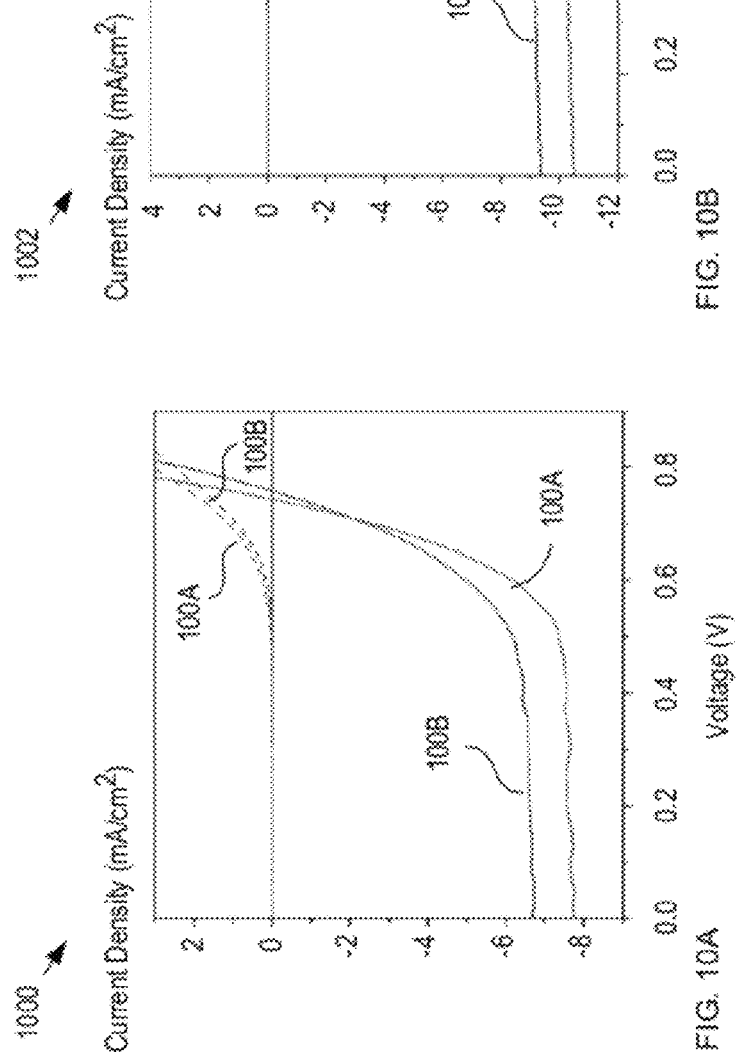
FIG. 10A
FIG. 10B
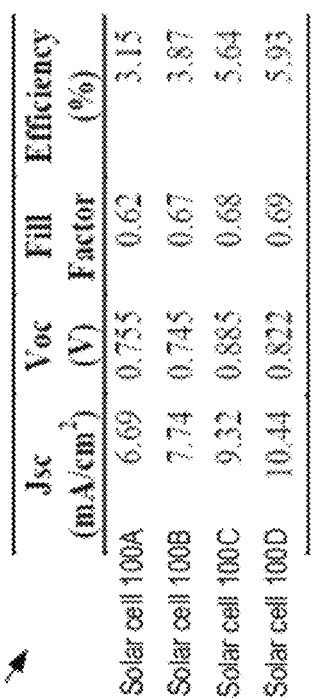
FIG. 11

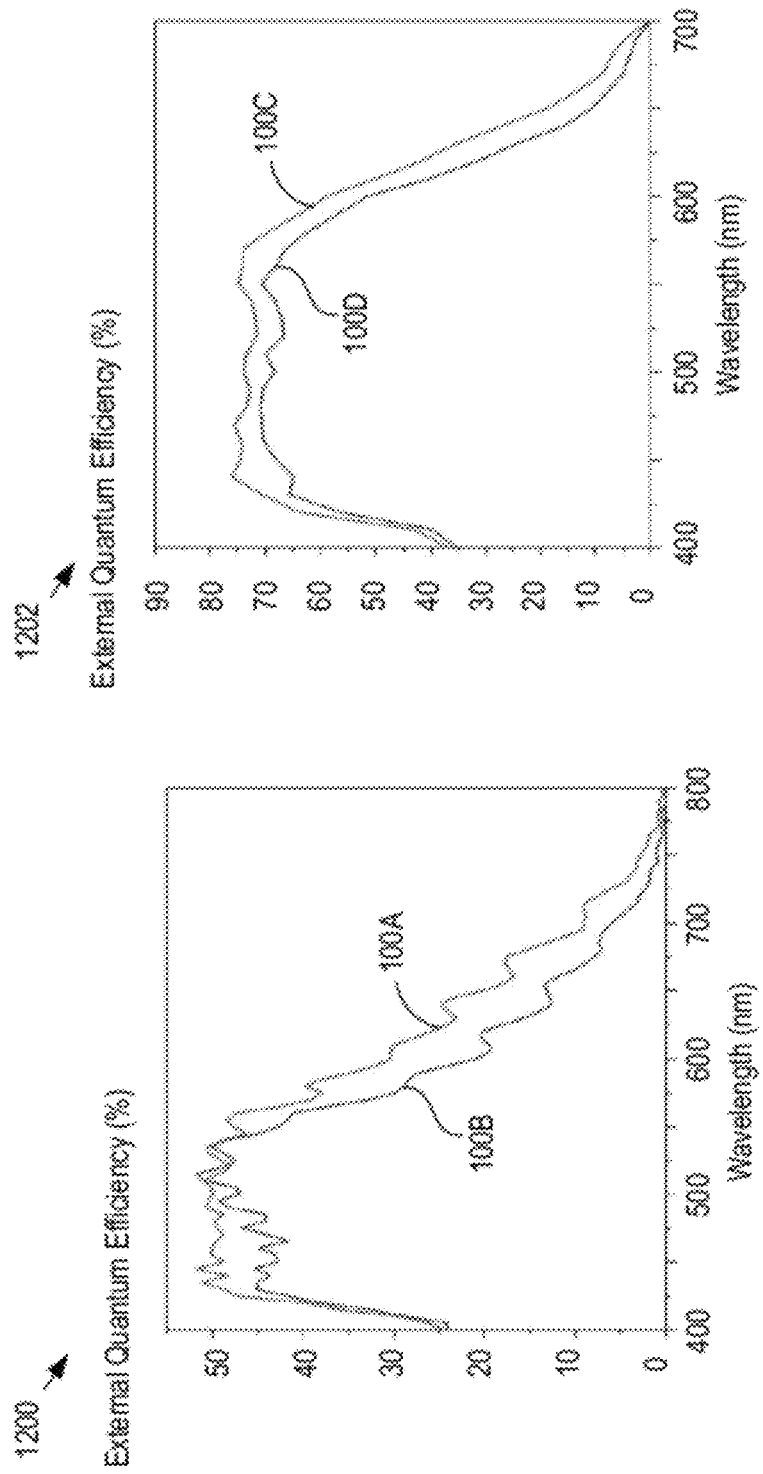

SOLAR CELL COMPRISING A PLASMONIC BACK REFLECTOR AND METHOD THEREFOR

CROSS REFERENCE TO RELATED APPLICATIONS

This case is a continuation-in-part of U.S. patent application Ser. No. 12/909,064, entitled "Optoelectronic Semiconductor Device and Method of Fabrication," filed Oct. 21, 2010, which claims the benefit of U.S. Provisional Application Ser. No. 61/254,513, filed Oct. 23, 2009, entitled "Optoelectronic Semiconductor Device and Method of Fabrication" and U.S. Provisional Application Ser. No. 61/263,582, filed Nov. 23, 2009, entitled "Substrate Comprising a Nanometer-scale Projection Array,". This application also claims priority of provisional patent application U.S. Ser. No. 61/458,678, filed Nov. 29, 2010. The entire contents of each of these cases are incorporated herein by reference.

If there are any contradictions or inconsistencies in language between this application and one or more of the cases that have been incorporated by reference that might affect the interpretation of the claims in this case, the claims in this case should be interpreted to be consistent with the language in this case.

STATEMENT REGARDING FEDERALLY SPONSORED RESEARCH

This invention was made with Government support under contract DE-FG36-08G018004 awarded by the Department of Energy. The Government has certain rights in the invention.

FIELD OF THE INVENTION

The present invention relates to optoelectronic devices in general, and, more particularly, to photovoltaic devices.

BACKGROUND OF THE INVENTION

Solar cells are electrical devices capable of converting solar energy into electrical energy without the generation of pollutants or other undesirable byproducts. As a result, solar cell technology has become of great interest in recent years as part of the worldwide push toward environmentally friendly alternatives to petrochemical-based energy production.

A solar cell commonly comprises a semiconductor that absorbs sunlight. Although sunlight includes light having wavelengths within the range of approximately 300 nanometers (nm) to 1200 nm, most semiconductor-based solar cells only absorb light within the range of approximately 300 nm to approximately 800 nm. The absorbed light gives its energy to electrons within the semiconductor, which excites them into the conduction band of the semiconductor. When a voltage is applied to the semiconductor, the flow of excited electrons is enabled, which gives rise to an electric current. This current can then be used to power an external device or charge an electrical storage device, such as a battery. Unfortunately, solar cells tend to be inefficient energy converters and quite expensive to manufacture. As a result, the cost to generate electrical energy using conventional solar cells has not been competitive with fossil-fuel-based energy generation, which has limited the adoption of solar-cell technology.

Recently, thin-film solar cells have been introduced, wherein the solar cells that are a few microns thick are formed on relatively inexpensive, large substrates (e.g., glass, plastic, stainless steel, etc.), rather than the more traditional relatively expensive, smaller silicon substrates. This advance offers the potential for cost reductions as well as an opportunity to employ more exotic materials to improve energy-conversion efficiency.

One type of thin-film solar cell that has received widespread attention is the dye-sensitized solar cell (DSC). DSCs have been demonstrated with relatively high power-conversion efficiency and low cost. Further, they offer promise for improving light harvesting in the 600-900 nanometer (nm) wavelength sub-range of solar light, which could increase power-conversion efficiency over 15%.

A classic DSC structure comprises a transparent anode deposited on the back of a transparent substrate, such as glass, on which a thin layer of titanium dioxide ($TiO_2$) is formed. This substrate is then immersed in a mixture of a photosensitive dye and solvent. After soaking the film in the dye solution, a thin layer of dye remains covalently bonded to the surface of the titanium dioxide. This substrate is then joined with another substrate that comprises a thin layer of electrolyte disposed on a conductive electrode. When joined, the two substrates substantially seal in the electrolyte to keep it from leaking.

In a DSC, electron-hole free-carrier pairs are generated when light hits the photosensitive dye. The free electrons quickly diffuse across the titanium dioxide film and reach the anode before they can recombine with free holes. The dye molecules, therefore, are oxidized (i.e., become positively charged) due to their loss of an electron to the titanium dioxide. They recover their neutral state, however, by stealing electrons from iodide ions in the electrolyte, which thereby oxidize to form positively charged iodine. The iodine then diffuses to the opposite electrode (i.e., the cathode). As a result, the electrons and the holes become separated so that these charges can be collected at the different electrodes where they can form an electric current for an external circuit. The electrolyte enables rapid reduction of the dye molecules thus impeding recombination of the electron hole pairs, referred to as "charge splitting." If the electrodes are connected through an external circuit, current will flow through the solar cell, enabling the electrolyte to regain its initial state.

Unfortunately, DSCs comprising liquid electrolytes have several drawbacks, including leakage of the electrolyte, and electrolyte volatility. Further, liquid electrolytes are typically corrosive, making them difficult to work with in a fabrication environment.

Solid-state DSCs (ss-DSCs) provide an alternative to liquid-based DSCs and overcome many of the issues faced by liquid-based DSCs, however. In an ss-DSC, the liquid electrolyte is replaced by a solid-state hole-transport material. The most common device architecture includes a porous layer of titanium dioxide nanoparticles whose surface area is coated with a photosensitive dye, and which is impregnated with a hole-transport material. The porous layer of titanium dioxide nanoparticles acts as a "scaffold" that can hold large numbers of the dye molecules in a three-dimensional matrix, enabling the inclusion of many more dye molecules on the surfaces of its internal pores than could be included just on the outside surface area of a solar cell. In addition to avoiding the problems of electrolyte leakage, volatility, and corrosiveness, solid-state hole transport material also offers a potential for higher energy-conversion efficiency.

Conventional solid-state DSCs are not without problems, however. First, electron-hole recombination in the devices leads to reduced energy-conversion efficiency. Second, the hole-transport material tends to fill the pores of the porous titanium dioxide layer incompletely when applied. These factors combine to limit the practical thickness for ss-DSCs to only about two microns. This thickness is significantly less than the thickness desired for efficient light absorption in the active layer. The resultant poor light absorption further reduces the energy-conversion efficiency of ss-DSCs.

In order to improve light absorption in the active layer, efforts have been directed toward the development of dyes that more strongly absorb light, as well as toward improved titanium dioxide nanostructure layers that have more internal surface area available for dye adsorption. Such efforts have had limited success in improving the overall energy-conversion efficiency of ss-DSCs, however.

An ss-DSC having improved energy-conversion efficiency as well as improved cost competitiveness with respect to other energy conversion methods would represent a significant advance in the state of the art.

SUMMARY OF THE INVENTION

The present invention provides a solid-state dye-sensitized solar cell that overcomes some of the costs and disadvantages of the prior art. An ss-DSC in accordance with the present invention comprises a plasmonic back reflector. The plasmonic back reflector includes a surface that is corrugated with a two-dimensional arrangement of nanometer-scale features. These features enable plasmonic effects that can improve light absorption in the active layer of an ss-DSC and, thus, improved energy-conversion efficiency. Embodiments of the present invention are particularly well suited for use in energy conversion systems, solar panels, and portable power supplies.

An illustrative embodiment of the present invention comprises a solid-state dye-sensitized solar cell that includes first and second electrodes, which are interposed by an active layer comprising a mesoporous layer of titanium dioxide that comprises a sensitizing dye and is infiltrated with hole-transport material. The active layer comprises a nanoimprinted surface, on which an over layer of hole-transport material and second electrode are disposed such that the nanostructure of the nanoimprinted surface is maintained in these layers. The nanoimprinted surface is formed using an inexpensive nanoimprint lithography method that is compatible with low-cost high-volume manufacturing.

In some embodiments, the solar cell is fabricated by a method that includes operations wherein: an active layer is formed on a substrate that acts as a substantially transparent electrode; a first surface of the active layer is nanoimprinted to form a surface that is corrugated with a two-dimensional arrangement of nanometer-scale features; the active layer is coated with a sensitizing dye; the active layer is infiltrated with hole-transport material such that a substantially conformal overlayer of hole-transport material is formed on the first surface; and a conformal electrode is formed on the overlayer. In some embodiments, the two-dimensional arrangement substantially defines a hexagonal array. In some embodiments, the hexagonal array has a period of approximately 900 nm. In some embodiments, the hexagonal array has a period that is within the range of approximately 400 nm to approximately 900 nm. In some embodiments, the arrangement and size of the nanometer-scale features are selected to enhance light absorption within a desired range of wavelengths. In some embodiments, this specific range of wavelengths is selected as the wavelengths within the range of approximately 400 nm to approximately 900 nm.

In some embodiments, the active layer comprises a mesoporous layer of titanium dioxide whose surface area is coated with a sensitizing dye. In some embodiments, the hole-transport material comprises a layer of 2,2',7,7'-tetrakis-(N,N-di-p-methoxyphenylamine) 9,9'-spirobifluorene. In some embodiments, nanoimprinting is used to enable plasmonic effects in thin-film solar cells wherein the active layer is other than a dye-sensitized layer of titanium dioxide, such as a polymer. In some embodiments, the active layer comprises sensitizing agent that comprises a dye monolayer or inorganic semiconductors disposed on a titanium dioxide layer. In some embodiments, the active layer comprises a mesoporous layer having pores coated with a sensitizing agent comprising a dye monolayer or inorganic semiconductor monolayers or quantum dots.

In some embodiments, the formation of the nanoimprinted surface forms the plasmonic layer, which improves light absorption by excitation of localized surface plasmon resonances of metallic nanoparticles and/or scattering of light by metallic nanoparticles into dielectric-like waveguide modes and/or modes generation of propagating surface plasmon polariton modes.

An embodiment of the present invention is a solid-state dye-sensitized solar cell comprising: a nanoimprinted surface, wherein the nanoimprinted surface includes a first arrangement of surface features; and an electrode disposed on the nanoimprinted surface, wherein the electrode comprises a second arrangement of surface features that are based on the first arrangement of surface features, and wherein the second arrangement of surface features collectively define a plasmonic surface.

BRIEF DESCRIPTION OF THE DRAWINGS

FIGS. 3A-D depict schematic drawings of cross-sectional views of solar cell 100 at different points in its fabrication.

FIGS. 6A-C depict schematic drawings of a cross-sectional view of a portion of master template 400 at different points in its fabrication.

FIGS. 10A and 10B depict measured current-density-voltage characteristics for solar cells in accordance with the illustrative embodiment of the present invention.

FIG. 11 depicts measurement data for solar cells 100A through 110D in accordance with the illustrative embodiment of the present invention.

FIGS. 12A and 12B depict measured external quantum efficiency versus wavelength for solar cells in accordance with the illustrative embodiment of the present invention.

DETAILED DESCRIPTION

The following terms are defined for use in this Specification, including the appended claims:

Disposed on or Formed on is defined as "exists on" an underlying material or layer. This layer may comprise intermediate layers, such as transitional layers, necessary to ensure a suitable surface. For example, if a material is described to be "disposed (or grown) on a substrate," this can mean that either (1) the material is in intimate contact with the substrate; or (2) the material is in contact with one or more layers that interpose the material and the substrate.

Nanoimprinted surface is defined as a surface having proactively created surface structure that has dimensions within the range of approximately 1 nm to 1000 nm, and which is created via nanoimprint lithography techniques, such as hard nanoimprint lithography or soft nanoimprint lithography.

Plasmonic surface is defined as a surface comprising nanometer-scale surface features that collectively support the development of plasmonic effects. For example, a solar cell electrode that reflects light back into the solar cell, wherein the electrode comprises a plurality of nanometer-scale surface features that collectively give rise to localized surface plasmon resonances and/or scattering of light by metallic particles into dielectric-like waveguide modes of the solar cell and/or coupling of light into propagating surface plasmon polariton modes is a plasmonic surface referred to as a plasmonic back reflector.

Improvements in the energy-conversion efficiency of a solar cell can be gained by incorporating nanostructure that induces plasmonic effects that improve light absorption. It is an aspect of the present invention that nanoimprinting enables a cost-effective fabrication method suitable for the formation of solar cell structures that include such nanostructure in one or more constituent layers.

Figure 1:
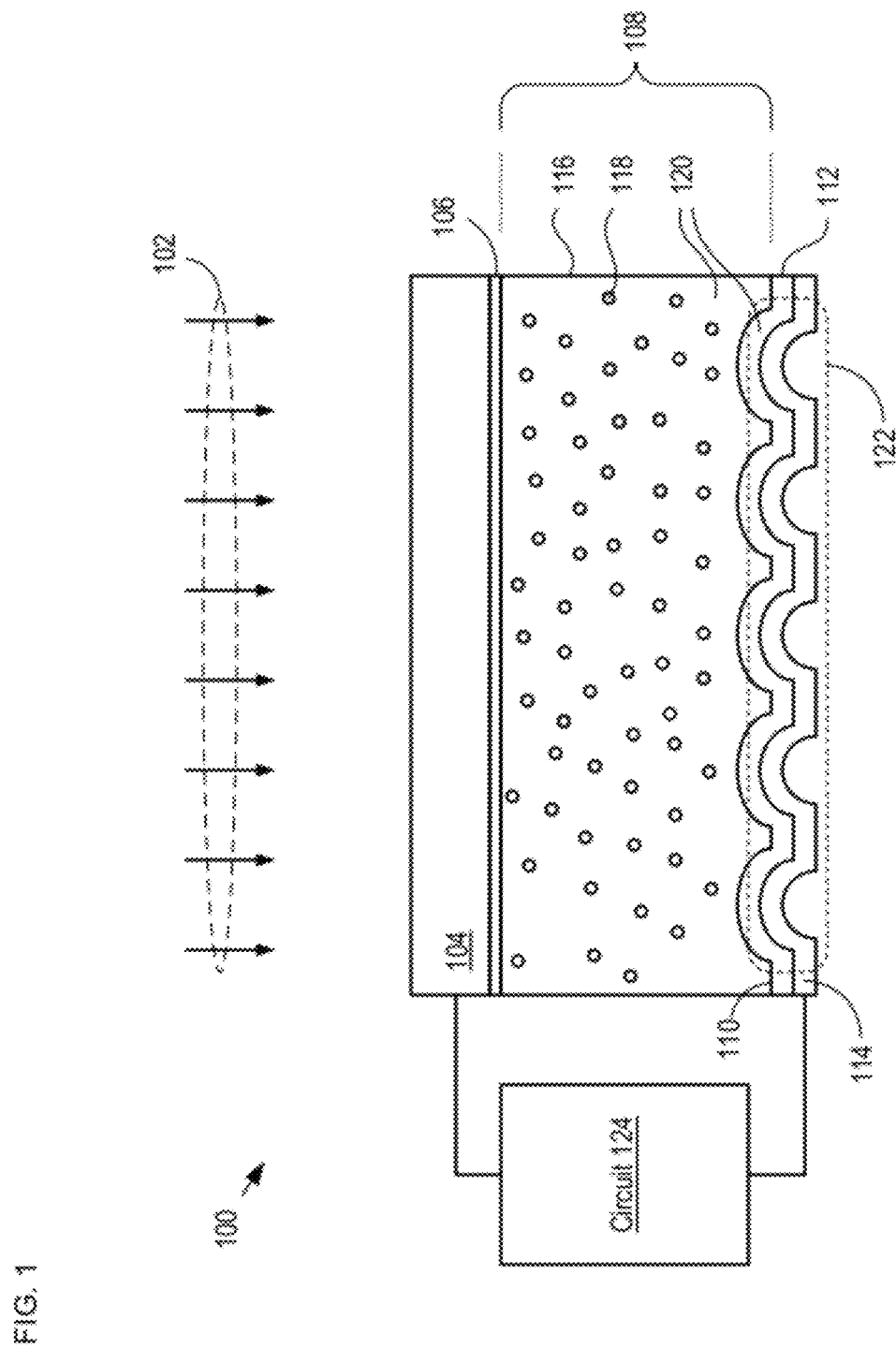
FIG. 1 depicts a schematic drawing of a cross-sectional view of a solid-state dye-sensitized solar cell comprising a nanoimprinted surface in accordance with an illustrative embodiment of the present invention.

FIG. 1 depicts a schematic drawing of a cross-sectional view of a solid-state dye-sensitized solar cell comprising a nanoimprinted surface in accordance with an illustrative embodiment of the present invention. Solar cell 100 includes electrode 104, interface layer 106, active layer 108, hole-transport overlayer 112, and electrode 114.

Solar cell 100 is suitable for absorbing a portion of the optical energy of sunlight 102 and converting it into electrical energy. Sunlight 102 spans a very broad spectral range from approximately 300 nm to approximately 2000 nm. For practical purposes, however, solar cell 100 is designed to absorb solar energy across the range of wavelengths within the range of approximately 300 nm to approximately 1200 nm. Further, solar cell 100 is designed with enhanced absorption of solar energy within the range of approximately 400 nm to approximately 900 nm. It is an aspect of the present invention that improved absorption in this wavelength range can be attained and exploited to yield improved energy-conversion efficiency in a solar cell structure that can be manufactured in volume at low cost. Embodiments of the present invention promise compatibility with high-volume manufacturing processes such as roll-to-roll, reel-to-reel, and large-area display fabrication systems. In addition, embodiments of the present invention are compatible with processes suitable for forming solar cells on large, relatively inexpensive substrates of non-silicon materials, such as glass, plastic, or stainless steel.

Figure 2:
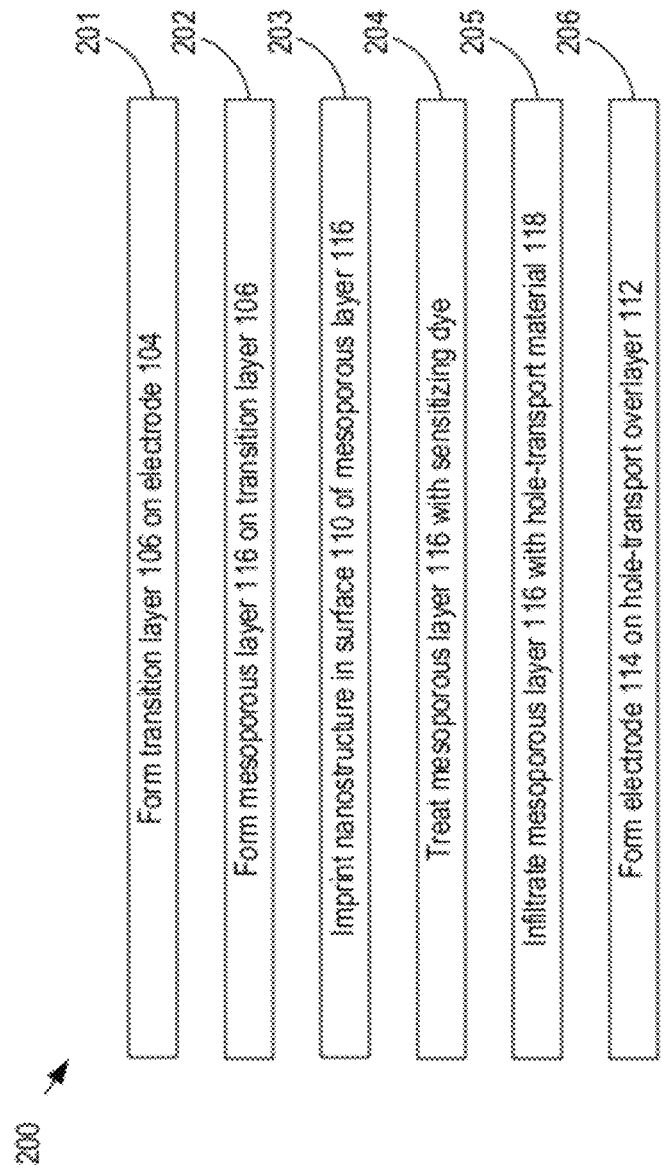
FIG. 2 depicts operations of a method suitable for formation of a solid-state dye-sensitized solar cell comprising a nanoimprinted surface in accordance with the illustrative embodiment of the present invention.

FIG. 2 depicts operations of a method suitable for formation of a solid-state dye-sensitized solar cell comprising a nanoimprinted surface in accordance with the illustrative embodiment of the present invention. Method 200 begins with operation 201, wherein transition layer 106 is formed on electrode 104.

FIGS. 3A-D depict schematic drawings of cross-sectional views of solar cell 100 at different points in its fabrication. FIGS. 3A-D are described with continuing reference to FIGS. 1 and 2.

Electrode 104 is an electrically conductive layer that is substantially transparent for wavelengths from 300 nm through 1200 nm. In some embodiments, electrode 104 comprises a layer of electrically conductive material, such as a transparent conductive oxide (TCO), disposed on an optically transparent substrate, such as glass. In some embodiments, a substrate comprising a TCO is used as electrode 104. Materials suitable for use as electrode 104 include, without limitation, fluorine-doped tin oxide (FTO), indium tin oxide (ITO), titanium nitride (TiN), aluminum-doped zinc oxide (AZO), and the like.

Transition layer 106 is a layer of titanium dioxide having a thickness of approximately 50 nm. Transition layer 106 provides a barrier between hole-transport material and electrode 104. Although the illustrative embodiment comprises a transition layer comprising titanium dioxide, it will be clear to one skilled in the art, after reading this Specification, how to specify, make, and use alternative embodiments of the present invention wherein transition layer 106 comprises a different wide-bandgap oxide, such as zinc oxides (e.g., ZnO), tin oxide (e.g., $SnO_2$), doped-oxides (niobium-doped titanium oxide (Nb-doped $TiO_2$, etc.), and the like.

Transition layer 106 is formed via aerosol spray pyrolysis with air as a carrier gas; however, one skilled in the art will recognize, after reading this Specification, that transition layer 106 can be formed using other conventional deposition processes.

At operation 202, mesoporous layer 116 is formed on transition layer 106. Mesoporous layer 116 comprises a mesoporous layer of titanium dioxide and ethyl cellulose. Although the illustrative embodiment comprises a mesoporous layer comprising titanium dioxide, it will be clear to one skilled in the art, after reading this Specification, how to specify, make, and use alternative embodiments of the present invention wherein mesoporous layer 116 comprises a different wide-bandgap oxide, such as zinc oxides (e.g., ZnO), tin oxide (e.g., $SnO_2$), doped-oxides (niobium-doped titanium oxide (Nb-doped $TiO_2$, etc.), and the like.

Mesoporous layer 116 typically contains pores having diameters within the range from approximately 2 nm to approximately 50 nm. Each pore contributes additional surface area for coating with a sensitizing agent, such as sensitizing dye molecules (e.g., Z907, C220, etc.), inorganic semiconductors (e.g., $Sb_2S_3$, CdSe, etc.), and the like. As a result, more dye molecules can be included in active layer 108, which enables improved light absorption for solar cell 100. In some embodiments, the sensitizing agent coats the surface area as a monolayer or plurality of quantum dots.

Mesoporous layer 116 is formed in a series of steps, beginning with the formation of a layer of titanium dioxide nanoparticle-containing paste on transition layer 106 using a conventional doctor-blade system. An exemplary titanium dioxide nanoparticle paste can be formed by diluting commercially available anatase nano-particulate paste (e.g., 18NR-T manufactured by Dyesol) with an organic solvent (e.g., terpineol). Although the layer of nanoparticle past is preferably formed using a doctor-blade system, one skilled in the art will recognize, after reading this Specification, that other layer deposition techniques, such as screen-printing, wire coating, and the like, can be used to form the layer as well. This nascent layer of paste is then heated (e.g., at 125° C. for 10 minutes in air) to drive solvents from the layer, thereby leaving a mesoporous layer of titanium dioxide nanoparticles and ethyl cellulose.

An exemplary thickness for the nascent layer of nanoparticle past is roughly 2.0 to 2.2 microns, although this layer can be formed with any suitable thickness within the range of approximately 100 nm to approximately 15 microns. Little volumetric shrinkage of the past occurs during bake-out; therefore, the final thickness of mesoporous layer 116 is approximately the same as the thickness of the nascent paste layer. It should be noted that a solar cell having a relatively thin active layer is typically characterized by poor light absorption while a solar cell having a relatively thick active layer is typically characterized by high carrier recombination. As a result, the energy-conversion efficiencies for such solar cells tend to be lower than for ss-DSCs having active layers that are around 2 microns-thick.

FIG. 3A depicts solar cell 100 after formation of mesoporous layer 116 on transition layer 106.

At operation 203, surface 110 of mesoporous layer 116 is nanoimprinted with a master template to form nanoimprinted surface 302.

Figure 4:
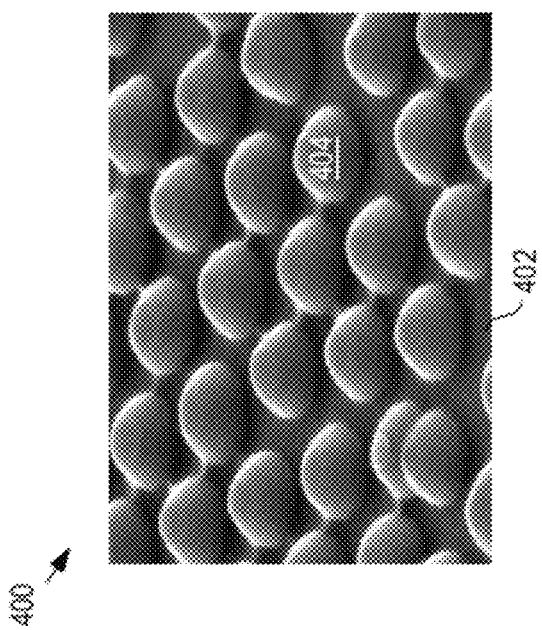
FIG. 4 depicts a scanning-electron microscope image of a portion of a master template suitable for nanoimprinting surface 110 in accordance with the illustrative embodiment of the present invention.

FIG. 4 depicts a scanning-electron microscope image of a portion of a master template suitable for nanoimprinting surface 110 in accordance with the illustrative embodiment of the present invention. Master template 400 comprises substrate 402 on which are formed substantially spherical projections 404 having a peak-to-valley height of approximately 400 nm. Projections 404 are arranged in a hexagonal close-packed arrangement having a period of approximately 900 nm. It should be noted that the design of master template 400 is based, in part, on the specific range of wavelengths over which light absorption efficiency improvement is desired. The design of master template 400, therefore, is merely one example of a suitable design for a master template. In some embodiments, a master template is used wherein at least one of the material, arrangement, pitch, height, and shape of projections is different from master template 400.

Figure 5:
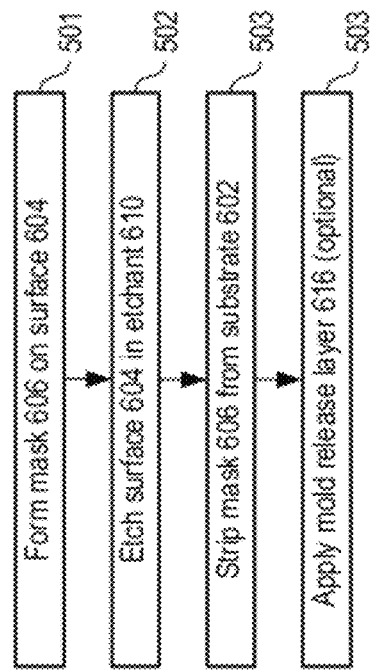
FIG. 5 depicts operations of a method suitable for forming master template 400.

FIG. 5 depicts operations of a method suitable for forming master template 400.

FIGS. 6A-C depict schematic drawings of a cross-sectional view of a portion of master template 400 at different points in its fabrication. FIGS. 6A-6C are described with continuing reference to FIGS. 1-5.

Method 500 begins with operation 501, wherein mask 606 is formed on surface 604 of substrate 602.

Substrate 602 is a conventional quartz substrate having sufficient thickness to withstand the pressures and temperatures of a nanoimprinting process.

Mask 606 comprises a monolayer of particles 608, which are dispersed on surface 604. Particles 608 are of silicon dioxide spheres having a substantially uniform diameter of approximately 900 nm. In some embodiments, particles 608 are particles of a material other than silicon dioxide. Materials suitable for use in particles 608 include, without limitation, metals, dielectrics, ceramics, semiconductors, polymers, composites, and the like. Particles 608 are arranged on surface 604 in a hexagonal close-packed arrangement. One skilled in the art will recognize that the periodicity of projections 612 is based on the size, shape, and configuration of particles 608, each of which is controllable. Although in the illustrative embodiment mask 606 comprises 900 nm-diameter silicon dioxide spheres that are arranged on surface 604 in a close-packed configuration, it will be clear to one skilled in the art, after reading this specification, how to specify, make, and use, alternative embodiments of the present invention wherein mask 606 comprises particles 608 that have any suitable shape or size and are arranged in other than a close-packed arrangement. In some alternative embodiments, mask 606 is formed using conventional mask layer deposition and patterning techniques, such as photolithography and etching.

Once particles 608 are arranged on surface 604, an optional reactive ion etch (RIE) can be used to tune the size of the particles to any desired smaller diameter. In order to reduce the diameter of particles 608, they can be subjected to a conventional silicon dioxide-selective RIE process. One skilled in the art will recognize, after reading this specification, how to etch the material of particles 608 over the material of substrate 602 with a desired etch selectivity.

FIG. 6A depicts a cross-sectional view of a portion of substrate 602 after formation of mask 606 on surface 604.

At operation 502, the pattern of mask 606 is transferred into surface 604 by etching mask 606 in an RIE via etchant 610. Etchant 610 is a gas, or combination of gases, that etches the material of particles 608 and the material of substrate 602. Depending upon the desired shape of projections 614, the relative etch rates for the materials of particles 608 and substrate 602 can be varied over a range of selectivity. One skilled in the art will recognize that the fidelity with which the pattern of mask 606 is transferred into surface 604 is dependent upon the specific etch conditions used during operation 502 and the selection of etch gas 610.

FIG. 6B depicts a cross-sectional view of a portion of master template 600 during the formation of projections 614. In FIG. 6B, projections 614 are depicted as partially formed projections 612.

During operation 502, the etching of surface 604 proceeds for a time period sufficient to fully form projections 614.

At operation 503, residual mask material is removed. Removal of the residual mask material is typically done via an etchant that selectively etches the material of mask 606 without significantly attacking the material of master template 600. After operation 503, surface 616 of master template 600 comprises a hexagonal close-packed arrangement of nanometer-scale domes (referred to as "nanodomes").

At operation 504, the surface 616 is coated with release layer 618, which facilitates removal of master template 600 from mesoporous layer 116 after nanoimprinting. Materials suitable for use as release layer 618 include, without limitation, a self-assembled monolayer of tridecafluoro-1,1,2,2-tretrahydrooctyltrichlorosilane, and the like. In some embodiments, release layer 618 is not used.

FIG. 6C depicts a cross-sectional view of a portion of fully formed master template 600 after removal of mask 602.

In some embodiments, projections 614 are formed in an isotropic RIE process that etches substrate 602 selectively over particles 608. The isotropic nature of such an RIE process can result in severe undercutting of each of particles 614, enabling the formation of projections that have columnar or conical shape. The resultant shape of projections 614 is based on the duration of the RIE process and the size of particles 608.

In some embodiments, surface 604 is etched in a non-reactive ion etch process, such as wet chemical etching. It will be clear to one skilled in the art, after reading this specification, how to form projections 614 that have a shape other than a hemispherical dome, such as a circular cone, a cylinder, column, or other desired shape.

During operation 203, master template 600 is embossed into surface 110 with sufficient pressure, and for a sufficient time to leave a lasting impression of surface 616 in surface 110—thus forming nanoimprinted surface 302. Typically, mesoporous layer 116 is held at an elevated temperature during nanoimprinting. Because ethyl cellulose occupies the spaces between the titanium dioxide particles in mesoporous layer 116, the titanium dioxide film is not further compacted during the nanoimprinting process. As a result, mesoporous layer 116 substantially retains its porosity and total surface area. For exemplary purposes, a suitable process for forming nanoimprinted surface 302 includes forcing master template 600 into mesoporous layer 116 (using a commercially available nanoimprinting system) with approximately 70 bars of pressure for approximately 1 minute while mesoporous layer 116 is held at approximately 180° C. Such nanoimprinting conditions leave nanoimprinted surface 302 with impressions of nanodomes that have a base radius of approximately 300 nm, a depth of approximately 200 nm, and a center-to-center distance of approximately 900 nm. One skilled in the art will recognize that this is only one example of a suitable nanoimprinting process suitable for forming nanoimprinted surface 302, for example, nanoimprinting lithography can be done at lower or higher pressures temperatures and/or lower or higher pressures.

After the formation of nanoimprinted surface 302, mesoporous layer 116 is sintered at a temperature typically within the range of approximately 400° C. to approximately 650° C. and then typically treated with $TiCl_4$.

Figure 7:
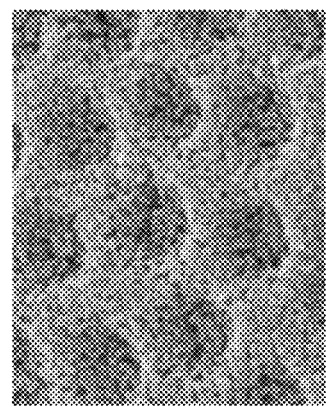
FIG. 7 depicts a scanning-electron microscope image of a portion of a mesoporous layer after operation 203.

FIG. 7 depicts a scanning-electron microscope image of a portion of a mesoporous layer after operation 203.

In some embodiments, nanoimprinted surface 302 is formed using "soft-nanoimprint lithography (S-NIL)." In such an S-NIL approach, a layer of elastomer is formed on master template 600 and removed as a stand-alone mold that retains the structure of surface 616 in at least one surface. Materials suitable for use in S-NIL include, without limitation, photo-definable polymers (e.g., polyimides, etc.), thermally curable polymers, polymeric organo-silicon compounds (e.g., polydimethylsiloxane (PDMS), etc.), and the like. The mold is "pressed" into nascent mesoporous layer 116 while the mesoporous layer is still in a liquid-like state—often using little or no pressure beyond the weight of the mold itself. After the surface texture of the polymer layer is transferred into the nascent mesoporous layer, the organic solvent is evaporated from the mesoporous layer 116 at room temperature or at a slightly elevated temperature (e.g., 100-125° C.). In some embodiments, the mold comprises a material that is at least partially permeable for organic solvents and solvent evaporation occurs while the mold is left on the top of nascent mesoporous layer 116. After solvent evaporation, the mold is removed thereby leaving nanoimprinted surface 302 on nascent mesoporous layer 116.

At operation 204, mesoporous layer 116 is treated with sensitizing dye to coat the surface area of the layer (including its included pores) with dye molecules 118. Typically, the sensitizing dye is applied by immersing mesoporous layer 116 in a solution containing dye molecules 118. Sensitizing dyes suitable for use in the present invention include, without limitation, ruthenium-based dyes (e.g., Z907, N719, N749, etc.), organic dyes (e.g., C220), and inorganic semiconductors (e.g., $Sb_2S_3$, CdSe, etc.). Mesoporous layer 116 is left to soak in the dye solution for time sufficient for the dye molecules to diffuse completely through the layer (typically within the range of a few hours to approximately one day). In some embodiments, mesoporous layer 116 is treated with sensitizing dye prior to the formation of nanoimprinted surface 302.

A first representative dye treatment for coating mesoporous layer 116 includes a 12-18 hour immersion a 0.3 mM Z907 dye solution in a 1:1 mixture of acetonitrile and tert-butyl alcohol.

A second representative dye treatment for coating mesoporous layer 116 includes an approximately 2 hour immersion in a 0.1 mM C220 dye solution in a 1:1 mixture of acetonitrile and tert-butyl alcohol.

At operation 205, the dye-containing mesoporous layer is infiltrated with hole-transport material 120 to fill the pores of mesoporous layer 116 and complete the formation of active layer 108. Operation 205 also results in the formation of overlayer 112 on nanoimprinted surface 302.

Hole-transport material 120 comprises 2,2',7,7'-tetrakis-(N,N-di-p-methoxyphenylamine)-9,9'-spirobifluorene (hereinafter referred to as "spiro-OMeTAD"). A representative mixture suitable for use as hole-transport material 120 is spiro-OMeTAD dissolved in chlorobenzene at a concentration of approximately 225 mg/mL, with 4-tert-butyl pyridine (tbp) added with a volume-to-mass ratio of 1:10.3 µL/mg. To this solution is added a mixture of lithium bis(trifluoromethylsulfonyl)imide salt (Li-TFSI) ionic dopant pre-dissolved in acetonitrile at 170 mg/mL, at 1:4.8 µL/mg of Li-TFSI solution:spiro-OMeTAD.

During operation 205, a known quantity of hole-transport material 120 is deposited onto mesoporous layer 116 and controllably distributed over nanoimprinted surface 302 by spin coating at a controlled speed. The quantity of hole-transport material deposited, as well as the speed of the spin-coater, is based on the concentration of spiro-OMeTAD in hole-transport material 120 as well as the desired thickness of overlayer 112. For exemplary purposes, a representative process includes the deposition of approximately 30 µL of hole-transport material on the sample and a spin-speed of approximately 2000 RPM for about 45 seconds (in air). This results in an overlayer having a thickness of within the range of approximately 100 nm to approximately 200 nm. The thickness of overlayer 112 can be controlled by adjusting the solution concentration between 180-225 mg/mL, and/or adjusting the spin coating speed between 1200 and 3000 RPM.

Overlayer 112 plays a critical role in the operation of solar cell 100, as it disallows direct contact between electrode 114 and the titanium dioxide in mesoporous layer 116. The thickness of overlayer 112 must be carefully controlled. If overlayer 112 is less than approximately 100 nm, it can enable direct contact between electrode 114 and the titanium dioxide in mesoporous layer 116, which can lead to shunting pathways for charge carriers. If, on the other hand, overlayer 112 is thicker than approximately 300 nm, overlayer 112 will substantially erase the nanostructure of nanoimprinted surface 302—effectively planarizing the surface. For most applications, an optimum thickness for spiro-OMeTAD overlayer is within the range of approximately 100 nm to approximately 200 nm.

Although in the illustrative embodiment, hole-transport material 120 is applied by spin coating, it will be clear to one skilled in the art, after reading this Specification, how to specify, make, and use alternative embodiments of the present invention wherein hole-transport material 120 is controllably distributed over nanoimprinted surface 302 via a method other than spin coating. Suitable alternative application methods include, without limitation, screen-printing, doctor blading, wire coating, and the like.

FIG. 3C depicts solar cell 100 after infiltration of mesoporous layer 116 with hole-transport material 118 and the formation of overlayer 112. After operation 205, nascent solar cell 100 is stored in a desiccator for approximately 4 hours.

At operation 206, electrode 114 is formed on overlayer 112. Electrode 114 is a layer of silver having a thickness of approximately 200 nm using conventional metal deposition techniques, such as evaporation, e-beam evaporation, sputtering, and the like. In some embodiments, the electrode 114 has a thickness other than 200 nm. Although in the illustrative embodiment electrode 114 comprises silver, it will be clear to one skilled in the art, after reading this Specification, how to specify, make, and use alternative embodiments of the present invention wherein electrode 114 comprises a different electrically conductive material that is suitable for use in a plasmonic back reflector.

FIG. 3D depicts solar cell 100 after deposition of electrode 114.

Figure 8:
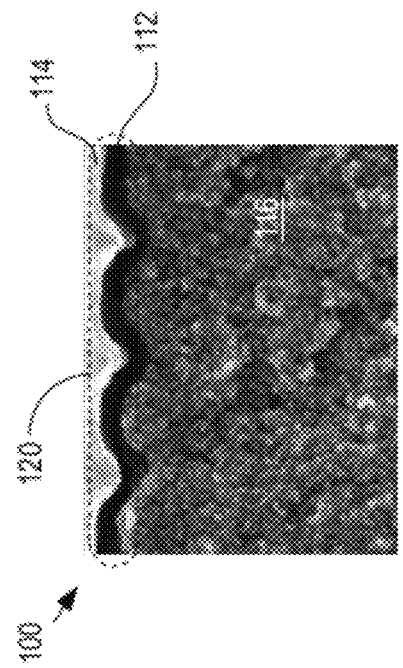
FIG. 8 depicts a scanning-electron microscope image of a cross-sectional view of a portion of fully formed solar cell 100.

FIG. 8 depicts a scanning-electron microscope image of a cross-sectional view of a portion of fully formed solar cell 100.

Electrode 114 is substantially conformal with nanoimprinted surface 302, which results in electrode 114 comprising a two-dimensional arrangement of silver nanodomes, which collectively define a plasmonic surface (i.e., plasmonic back reflector 122).

It is an aspect of the present invention that plasmonic back reflector 122 enhances light absorption in solar cell 100 through excitation of plasmonic modes as well as increased light scattering. As a result, solar cells comprising a plasmonic back reflector formed on a nanoimprinted surface can have energy conversion efficiencies greater than solar cells in the prior art. Plasmonic back reflector 122 affords spectral enhancements in the photocurrent density by 1) excitation of localized surface plasmon (SP) resonances of metallic nanoparticles, which occur when conduction electrons in finite-sized particles are driven into oscillation; 2) scattering of light by metallic nanoparticles into dielectric-like waveguide modes of the solar cell; and 3) coupling to propagating surface plasmon polariton (SPP) modes, which are surface electromagnetic waves that propagate along metal surfaces.

The efficient excitation of localized SP resonances depends on the geometry, size, shape, and dielectric environment of the metal particles, and field enhancements are produced in only very close-proximity to the metallic nanoparticles (within ~10 nm).

In contrast, propagating SPP waves are most efficiently excited by periodic grating structures, which enable free space light waves to pick up sufficient in-plane momentum to couple to the shorter wavelength (higher propagation constant) SPP waves. SPPs have their highest field intensity at the metal-dielectric interface; however, they also exhibit a large penetration depth (100 nm-1 μm) into the dielectric medium adjacent to the metal. For this reason, the excitation of SPP can produce absorption enhancements in thicker active layers of a solar cell. Coupling to dielectric waveguide modes can be enhanced by exploiting plasmonic effects near the surface plasmon frequency of metallic particles, their scattering ability (i.e. cross section) is resonantly enhanced and the scattering into both dielectric-like and SPP modes can be increased.

Figure 9:
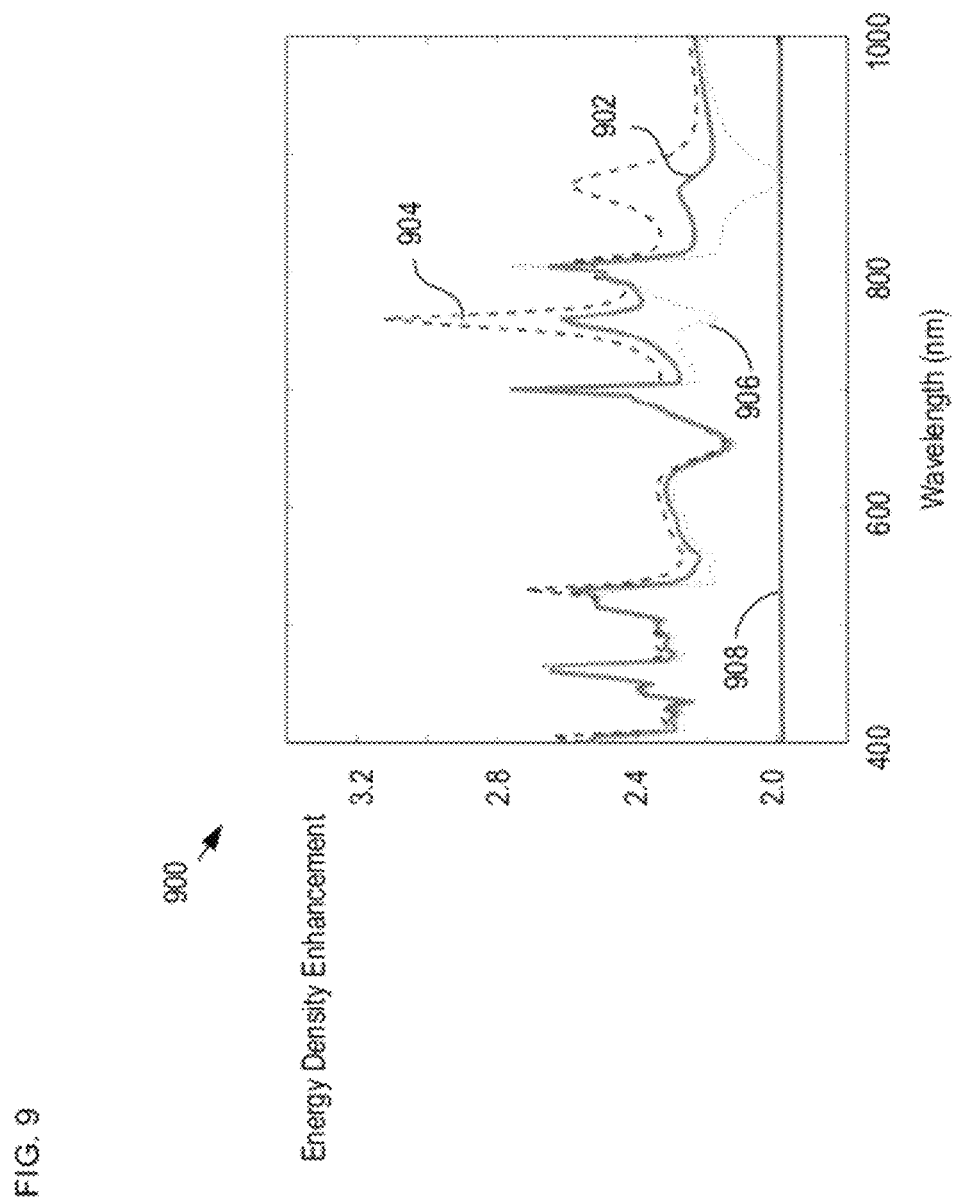
FIG. 9 depicts simulation results of the spectral dependence of energy-density enhancement for an idealized solar cell in accordance with the illustrative embodiment of the present invention.

FIG. 9 depicts simulation results of the spectral dependence of energy-density enhancement for an idealized solar cell in accordance with the illustrative embodiment of the present invention. Plot 900 shows the spectral dependence of energy-density enhancement in active layer 108 over the wavelength range of 400 nm to 1000 nm, with the assumption that the metallic nanostructure of back reflector 114 is covered with a uniform, non-absorbing dielectric.

Trace 902 depicts simulated energy-density enhancement based on the entire thickness of active layer 108, trace 904 depicts simulated enhancement based on only the lower half of the thickness of active layer 108 (i.e., the half proximal with the plasmonic back reflector), trace 906 depicts simulated enhancement based on only the upper half of the thickness of active layer 108 (i.e., the half distal to the plasmonic back reflector), and trace 908 provides a simulated response for a substantially planar reflector (i.e., without nanostructure) as a reference. Trace 908 is substantially uniform across the wavelength range.

Plot 900 demonstrates that the addition of plasmonic back reflector 114 gives rise to absorption enhancement over that of a planar metallic mirror. Trace 902 shows a number of peaks distributed over the wavelength range. For a conventional ultra-thin, plasmon-enhanced solar cell of the prior art, one skilled in the art would expect the number of such peaks would be limited to two or three. These are readily associated with the excitation of localized SP resonances and well-defined waveguide modes. In solar cell 100, which is a relatively thick solar cell by comparison, many peaks would be expected, some overlapping. These multiple peaks arise would be expected because such a structure supports a great number of waveguide modes, in addition to localized particle resonances.

Since the nanodome array exhibits multiple length scales both within the dome structure and the array, coupling to many of the allowed modes is possible. In order to provide a pragmatic separation between plasmonics and dielectric waveguiding effects in these thicker structures, therefore, the response in the 2 μm-thick active region 108 is also modeled as if active layer 108 were hypothetically split into two zones: lower zone, which is within the range of approximately 0.1 μm to approximately 1 μm away from the surface of back reflector 114 (response shown as trace 904); and upper zone, which is within the range of approximately 1 μm to approximately 2 μm away from the surface of back reflector 114 (response shown as trace 906).

Trace 904 evinces that both SPPs and light scattering contribute substantially to the energy buildup. Trace 906 corresponds to an upper zone (within the range of approximately 1 μm to approximately 2 μm away from the surface of back reflector 114. In this region, SPPs contribute very little to the overall absorption.

Upon careful examination, the simulation shown in plot 900 reveals a number of spectral features associated with the hexagonal array of silver nanodomes and the mechanisms that help to boost solar cell efficiency. For example, the resonances at wavelengths of 760 nm and 870 nm favoring only the energy buildup in the lower zone represent excited standing waves of SPPs in the flat metallic surfaces and around the domes, respectively. In contrast, the relatively sharp peaks at about 700 nm and 805 nm correspond to the coupling of scattered light into multimodal guided waves in the dielectric region, which is reasonably uniform across the entire 2 μm thickness.

We note that in actual devices, it would be expected that the resonant behavior would be less pronounced than that shown in plot 900, due to non-uniformity of geometrical parameters (height, shape and spacing) in nanoimprinted surface 302 and back reflector 114, as well as absorption-induced damping in the solar cell. For comparison, plot 900 includes the energy density enhancement in a previously optimized reference cell where a flat silver back-reflector is used (trace 908). In this reference case the enhancement factor possesses an almost constant value of slightly less than 2. Within the wavelength range of interest, the overall energy density in the nanodome-based structure is increased by about 20% as compared to the flat reference. When a realistic absorptive medium is used in the dielectric region, an improved light-harvesting capability is expected in nanodome-based plasmonic ss-DSCs, as the light absorption in the active region is directly related to the magnitude of the electric field squared (i.e. the light intensity).

FIGS. 10A and 10B depict measured current-density-voltage characteristics for solar cells in accordance with the illustrative embodiment of the present invention.

Plot 1000 depicts plots of current-density vs. voltage for solar cells 100A and 100B, each of which comprises a solar cell structure analogous to that of solar cell 100. Each of solar cells 100A and 100B is sensitized with Z907 sensitizing dye, which is a commercially available ruthenium-complex sensitizing dye commonly used for ss-DSCs. Z907 has a peak extinction coefficient of 12,200 $M^{-1}$ $cm^{-1}$ at 525 nm and a weak absorption tail that extends up to 750 nm. Solar cell 100A comprises a plasmonic back reflector formed conformally on a nanoimprinted surface, while solar cell 100B is a reference device that comprises a substantially flat back reflector.

Plot 1002 depicts plots of current-density vs. voltage for solar cell 100C and 100D, each of which comprises a solar cell structure analogous to that of solar cell 100. Each of solar cells 100C and 100D is sensitized with C220 sensitizing dye. C220 is a metal-free organic sensitizing dye, which is characterized by a very high peak extinction coefficient of 62,700 $M^{-1}$ $cm^{-1}$ at 525 nm and an absorption tail that drops off sharply above 600 nm. Solar cell 100C comprises a plasmonic back reflector formed conformally on a nanoimprinted surface, while solar cell 100D is a reference device that comprises a substantially flat back reflector.

FIG. 11 depicts measurement data for solar cells 100A through 110D in accordance with the illustrative embodiment of the present invention.

FIGS. 12A and 12B depict measured external quantum efficiency versus wavelength for solar cells in accordance with the illustrative embodiment of the present invention. Plot 1200 depicts plots of external quantum efficiency (EQE) versus wavelength for solar cells 100A and 100B. Plot 1202 depicts plots of EQE versus wavelength for solar cells 100C and 100D.

Several conclusions can be drawn from FIGS. 10-12. First, the addition of a plasmonic back reflector increased the short-circuit photocurrent ($J_{SC}$) of the Z907-doped solar cells by approximately 16%. Further, the addition of the plasmonic back reflector increased the power conversion efficiency (PCE) of the Z907-doped solar cells from 3.15% for solar cell 100B to 3.87% for solar cell 100A.

In similar fashion, the addition of a plasmonic back reflector increased the short-circuit photocurrent of the C220-doped solar cells by approximately 12%, while PCE increased from 5.64% for solar cell 100D to 5.93% for solar cell 100C.

These results are consistent with expectations since Z907 does not absorb light as strongly as C220; therefore, Z907 devices have greater potential efficiency improvement with the addition of a plasmonic back reflector.

Measurement of external quantum efficiency is useful for determining absorption enhancement because it substantially decouples the light absorption in the active layer from the parasitic absorption induced by silver electrode formed on a nanoimprinted surface.

Upon examination of plot 1200 it can be seen that the addition of a plasmonic back reflector increases EQE for Z907 dye-containing solar cells across the entire wavelength range of 400 nm to 800 nm. The increase is more pronounced in within the range of 550 nm to 750 nm, however, since Z907 dye does not absorb as strongly within this wavelength range.

Plot 1202 demonstrates that, although the improvement is not as pronounced as for Z907 dye-containing solar cells, solar cell 100C has enhanced absorption as compared to solar cell 100D across the wavelength range from 400 nm to 700 nm. The EQE enhancement is lower for C220 dye containing solar cells because C220 has a higher extinction coefficient and a sharper drop-off in the absorption tail. It is clear, however, that absorption is enhanced (and $J_{SC}$ is increased) by the addition of a nanoimprinted surface in a solar cell back reflector—even for strongly absorbing sensitizing dyes.

In accordance with the present invention, therefore, forming a back reflecting electrode on a nanoimprinted surface results in absorption enhancement that can be attributed to the excitation of surface plasmon polariton (SPP) modes and the light scattering from metallic nanodomes in the back reflector.

It should be noted that the descriptions herein relate to the formation of a nanoimprinted surface as part of a plasmonic back reflector structure of a titanium dioxide-based ss-DSC. It is an aspect of the present invention, however, that the present invention can be applied to any thin-film solar cell materials systems with active layer thickness on the scale of 0.5-10 micron, including, without limitation, amorphous silicon, CdTe and $Cu(In,Ga)Se_2$.

Further, the present invention is suitable for use in the formation of CdTe and GIGS solar cells, which use a Mo-coated glass as a substrate. In such devices, the active layer is formed after the metal deposition. Typically, the present invention nanoimprints the active layer prior to performing metal deposition. One skilled in the art will recognize, however, after reading this Specification, that the nanoimprinting method of the present invention can be applied to CdTe or GIGS cells, using a modified process, by patterning the metal electrode underneath GIGS or CdTe active layer. As a result, the present invention can enable improved performance of such solar cells.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A solid-state dye-sensitized solar cell comprising:
   a nanoimprinted surface, wherein the nanoimprinted surface includes a first arrangement of surface features; and
   an electrode disposed on the nanoimprinted surface, wherein the electrode comprises a second arrangement of surface features that are based on the first arrangement of surface features, and wherein the second arrangement of surface features collectively define a plasmonic back reflector.

2. The solar cell of claim 1 further comprising a first layer, the first layer comprising a hole-transport material, and the first layer interposing the nanoimprinted surface and the electrode, wherein each of the first layer and the electrode is substantially conformal with the nanoimprinted surface.

3. The solar cell of claim 1 further comprising an active layer, the active layer comprising the nanoimprinted surface.

4. The solar cell of claim 3 wherein the active layer comprises titanium dioxide, a hole-transport material, and a sensitizing agent.

5. The solar cell of claim 1 wherein the nanoimprinted surface comprises surface features arranged in a two-dimensional hexagonal close-packed array.

6. The solar cell of claim 5 wherein the two-dimensional hexagonal close-packed array has a period that is within the range of approximately 400 nm to approximately 1200 nm.

7. The solar cell of claim 5 wherein the two-dimensional hexagonal close-packed array has a period that is approximately 900 nm.

8. A method for forming a solid-state dye-sensitized solar cell comprising:
   forming a nanoimprinted surface, wherein the nanoimprinted surface includes a first arrangement of surface features; and
   forming an electrode disposed on the nanoimprinted surface such that the electrode comprises a second arrangement of surface features that are based on the first arrangement of surface features, wherein the second arrangement of surface features collectively define a plasmonic back reflector.

9. The method of claim 8 wherein the nanoimprinted surface is formed by operations comprising:
   providing a master template comprising a first surface comprising projections that are arranged in the first arrangement;
   arranging the first surface and a second surface such that the first surface and second surface are in physical contact, wherein the solar cell comprises the second surface; and
   applying a force between the master template and the solar cell, wherein the force is sufficient to embed the first surface into the second surface to induce an impression of at least a portion of the projections in the second surface.

10. The method of claim 8 wherein the nanoimprinted surface is formed by soft-nanoimprint lithography.

11. The method of claim 8 wherein the nanoimprinted surface is a surface of an active layer, the active layer having a mesoporous structure, and the active layer comprising a semiconductor, a sensitizing agent, and a hole-transport material.

12. The method of claim 8 further comprising forming a first layer that interposes the nanoimprinted surface and the electrode, wherein the first layer comprises a hole-transport material, and wherein the first layer is formed such that it is substantially conformal with the nanoimprinted surface.

13. The method of claim 12 wherein the first layer is formed such that it has a thickness within the range of approximately 50 nm to approximately 200 nm.

14. The method of claim 8 wherein the nanoimprinted surface is formed such that the first arrangement is a two-dimensional hexagonal close-packed array.

15. The method of claim 14 further comprising selecting a period for the array to enhance absorption of light within a range of wavelengths.

16. A method for forming a solid-state dye-sensitized solar cell comprising:
   nanoimprinting a first layer of the solar cell to form a nanoimprinted surface, wherein the first layer comprises a plurality of pores, and wherein the first layer comprises titanium dioxide;
   forming a second layer disposed on the nanoimprinted surface, the second layer comprising a hole-transport material; and
   forming an electrode disposed on the second layer;
   wherein each of the electrode and the second layer is substantially conformal with the nanoimprinted surface such that the electrode comprises a plurality of features that collectively define a plasmonic surface.

17. The method of claim 16 further comprising:
   treating the first layer to add a sensitizing agent to the first layer.

18. The method of claim 16 wherein the second layer is formed by operations comprising:
   dispensing a first material comprising the hole-transport material on the nanoimprinted surface;
   distributing the first material over the nanoimprinted surface; and
   controlling the thickness of the second layer by controlling at least one of (1) the quantity of first material dispensed on the nanoimprinted surface and (2) the concentration of the hole-transport material in the first material.

19. The method of claim 18 wherein the thickness of the second layer is controlled to be within the range of approximately 50 nm to approximately 200 nm.

20. The method of claim 16 wherein the first layer is nanoimprinted such that the nanoimprinted surface comprises surface features that are arranged in a two-dimensional hexagonal array.

21. The method of claim 20, wherein the hexagonal array has a first periodicity, and the surface features have a first average depth and a first average width, and wherein the first periodicity, first average depth, and first average width are selected to enhance light absorption in the solar cell within a first wavelength range.

22. The method of claim 21, wherein the first periodicity is approximately 900 nm, the first average depth is approximately 200 nm, and the first average width is approximately 600 nm.

* * * * *